(12) United States Patent
Luo

(10) Patent No.: US 12,437,991 B2
(45) Date of Patent: Oct. 7, 2025

(54) WAFER PROCESSING METHOD

(71) Applicant: UNITED MICROELECTRONICS CORPORATION, Hsinchu (TW)

(72) Inventor: Nuo-Wei Luo, Singapore (SG)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 822 days.

(21) Appl. No.: 17/562,045

(22) Filed: Dec. 27, 2021

(65) Prior Publication Data

US 2023/0162979 A1    May 25, 2023

(30) Foreign Application Priority Data

Nov. 22, 2021  (CN) .......................... 202111387024.3

(51) Int. Cl.
  *G03F 7/16* (2006.01)
  *H01L 21/027* (2006.01)

(52) U.S. Cl.
  CPC ............ *H01L 21/027* (2013.01); *G03F 7/168* (2013.01)

(58) Field of Classification Search
  CPC ............. G03F 7/168; G03F 7/162; G03F 7/18
  See application file for complete search history.

(56) References Cited

U.S. PATENT DOCUMENTS

| | | | |
|---|---|---|---|
| 6,353,209 B1 * | 3/2002 | Schaper | H01L 21/67103 118/725 |
| 6,733,936 B1 * | 5/2004 | Gu | G03F 7/168 430/311 |
| 9,753,370 B2 | 9/2017 | Hong et al. | |
| 10,062,943 B2 | 8/2018 | Li | |
| 10,109,474 B1 | 10/2018 | Wang et al. | |
| 10,153,342 B1 | 12/2018 | He et al. | |
| 10,262,986 B2 | 4/2019 | Dai et al. | |
| 10,460,980 B2 | 10/2019 | Verma et al. | |
| 2008/0249735 A1 * | 10/2008 | Chiang | H01L 22/26 257/E21.531 |
| 2013/0017376 A1 * | 1/2013 | Okuyama | G03F 7/038 430/296 |

OTHER PUBLICATIONS

Chris A. Mack, "Swing Curves", The Lithography Tutor, Summer 1994, 6 pages.
F. G. Tseng, "Lecture 2 Lithography I", Advance Micro System Fabrication and Lab, Lec 2, Fall 2016, pp. 1-19.
Harry J. Levinson, "Chapter 3 Photoresists", Principles of Lithography, Fourth Edition, 2019, pp. 53-122.

* cited by examiner

Primary Examiner — Daborah Chacko-Davis

(57) ABSTRACT

A wafer processing method includes: providing a wafer, wherein the wafer has a first position and a second position, and the first position faces the second position in a reference direction; coating a photoresist liquid on the wafer; and performing a heating process to heat the wafer coated with the photoresist liquid to form a photoresist layer on the wafer, wherein during the heating process, a temperature of the wafer gradually increases in the reference direction, so that a thickness of the photoresist layer gradually decreases in the reference direction.

10 Claims, 2 Drawing Sheets

WAFER PROCESSING METHOD

FIELD OF THE INVENTION

The present invention relates to a wafer processing method, and more particularly to a wafer processing method that enables a photoresist layer with a continuous thickness change on a single wafer.

BACKGROUND OF THE INVENTION

Semiconductor process technology generally uses linewidth as an index to evaluate process quality. Linewidth is also called critical dimension (CD). The smaller the critical dimension, the more electronic components can be placed on a wafer, which reduces the product volume. However, for wafers with different photoresist layer thicknesses, the energy absorbed by the photoresist layer and the reflectivity of the wafer are all different during the whole process, which leads to instability of the process and affects the critical dimension. The relationship between the critical dimension and the thickness of the photoresist layer presents a sinusoidal waveform, which is called a swing curve.

Therefore, semiconductor manufacturers will conduct random critical dimension measurements to find the best critical dimension and the best photoresist layer thickness. The conventional method is to set different rotation speeds on the spin coater for coating the photoresist, wherein the faster the rotation speed, the smaller the thickness of the photoresist layer formed. In this way, multiple wafers with different photoresist layer thicknesses are produced. The critical dimension is measured after the subsequent exposure and development processes are performed. According to the thickness of the photoresist layer and the measured critical dimension, a sine corresponding waveform is fitted to obtain the thickness of the photoresist layer corresponding to the minimum critical dimension, that is, the optimal thickness of the photoresist layer. However, when the number of samples in the sampling experiment is not enough, the fitted sine corresponding waveform may not be able to obtain the true optimal photoresist layer thickness. To make the result more accurate and closer to the real situation, it is necessary to use more wafers with different photoresist layer thicknesses to increase the number of samples, which leads to a long sampling and measurement time and consumes a large number of wafers.

SUMMARY OF THE INVENTION

The present invention provides a wafer processing method, which can greatly reduce the number of wafers required in the critical dimension sampling measurement, and at the same time improve the accuracy of the critical dimension sampling measurement.

The wafer processing method provided by the present invention includes: providing a wafer, wherein the wafer has a first position and a second position, and the first position faces the second position in a reference direction; coating a photoresist liquid on the wafer; and performing a heating process to heat the wafer coated with the photoresist liquid to form a photoresist layer on the wafer, wherein during the heating process, a temperature of the wafer gradually increases in the reference direction, so that a thickness of the photoresist layer gradually decreases in the reference direction.

In an embodiment of the present invention, a distance between the first position and the second position is equal to a diameter of the wafer.

In an embodiment of the present invention, the heating process is performed by a heating device. The heating device includes a first heating unit, a second heating unit and a third heating unit, which are provided in sequence in the reference direction. A first set temperature of the first heating unit is lower than a second set temperature of the second heating unit, and the second set temperature is lower than a third set temperature of the third heating unit. After the heating process, a part of the photoresist layer at the first position of the wafer has a first thickness, and a part of the photoresist layer at the second position of the wafer has a second thickness, and the first thickness is greater than the second thickness.

In an embodiment of the present invention, the first set temperature, the second set temperature and the third set temperature are all between 90° C. and 110° C.

In an embodiment of the present invention, the heating process is performed by a heating device. The heating device has a top surface. The wafer is placed obliquely on the top surface. A distance between the wafer and the top surface gradually decreases in the reference direction. After the heating process is performed, a part of the photoresist layer at the first position has a first thickness, a part of the photoresist layer at the second position has a second thickness, and the first thickness is greater than the second thickness.

In an embodiment of the present invention, the first position of the wafer is placed on a spacer on the top surface of the heating device.

In an embodiment of the present invention, a height of the spacer is preferably between 0.1 mm and 2 mm, more preferably between 0.1 mm and 1 mm.

In an embodiment of the present invention, the thickness of the photoresist layer is between 9000 angstroms and 11500 angstroms.

The present invention provides a wafer processing method. Specifically, by gradually increasing the temperature of the wafer coated with the photoresist liquid from the first position to the second position in the reference direction during the heating process, the evaporation of the solvent in the photoresist liquid on the wafer is different, thereby forming a photoresist layer with inconsistent thickness, such that the thickness of the photoresist layer decreases in the reference direction. The wafer processing method of the present invention can form a photoresist layer with continuous thickness change on a single wafer, so that a single wafer can be used as multiple samples for the critical dimension sampling measurement. Therefore, the wafer processing method of the present invention can greatly reduce the number of wafers required for the critical dimension sampling measurement and at the same time improve the accuracy of the critical dimension sampling measurement.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
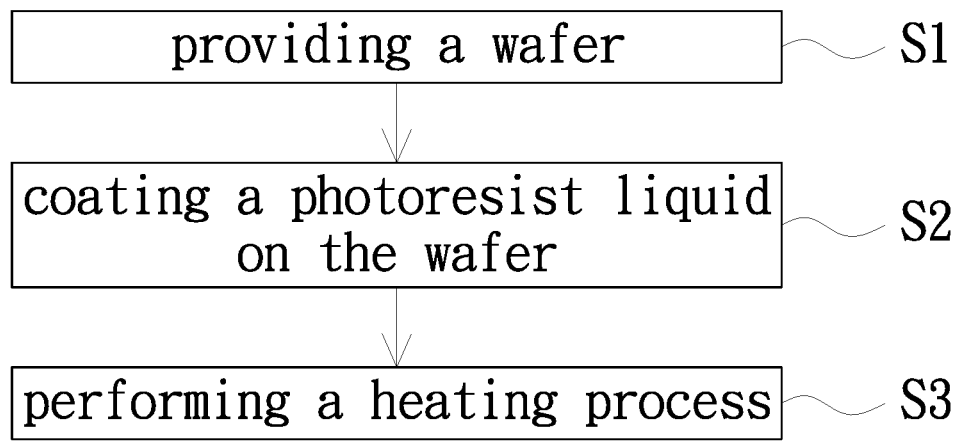
FIG. 1 is a schematic flowchart of a wafer processing method according to an embodiment of the present invention.
Figure 2:
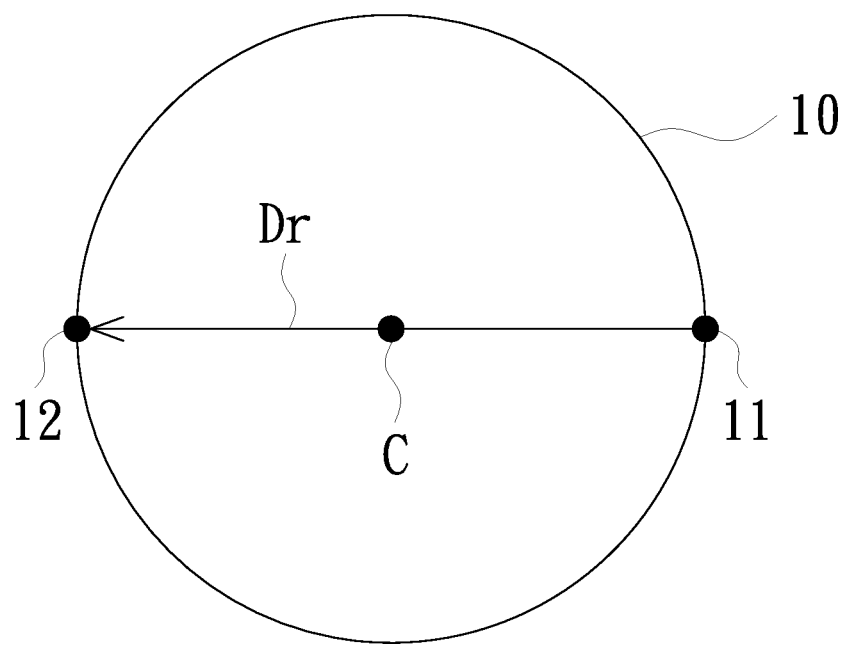
FIG. 2 is a schematic diagram of a wafer in a wafer processing method according to an embodiment of the present invention.

FIG. 1 is a schematic flowchart of a wafer processing method according to an embodiment of the present invention. FIG. 2 is a schematic diagram of a wafer in a wafer processing method according to an embodiment of the present invention. As shown in FIG. 1, the wafer processing method includes steps S1 to S3. Specifically, step S1: providing a wafer 10. The wafer 10 has a first position 11 and a second position 12 (shown in FIG. 2), and the first position 11 faces the second position 12 in the reference direction Dr. In an embodiment of the present invention, the first position 11 and the second position 12 are any two points at the edge of the wafer 10. Preferably, the connection between the first position 11 and the second position 12 passes through the center C of the wafer 10, that is, the distance between the first position 11 and the second position 12 is equal to the diameter of the wafer 10; however, the present invention is not limited thereto. The present invention can adjust the first position 11 and the second position 12 according to the desired thickness distribution of a photoresist layer in the subsequent steps, and the distance between the first position 11 and the second position 12 can be smaller than the diameter of the wafer 10.

Then, step S2: coating a photoresist liquid on the wafer 10. The method of coating the photoresist liquid can be spin coating, extrusion coating, spray coating or roll coating. Preferably, the spin coating is selected as the method of coating the photoresist liquid. When the photoresist liquid is coated onto the wafer 10 by spin coating, the rotation speed of a spin coater can be adjusted from 1000 rpm to 3000 rpm according to the properties of the photoresist liquid (e.g., viscosity) and the desired thickness of the photoresist layer.

Then, step S3: performing a heating process. A photoresist layer is formed on the wafer 10 by heating the wafer 10 coated with the photoresist liquid. The heating method can be an oven or a hot plate. When an oven is adopted, the temperature can be set between 80° C. and 90° C., and the heating time is between 10 minutes and 30 minutes. When a hot plate is adopted, the temperature can be set between 85° C. and 150° C., preferably between 90° C. and 110° C., and the heating time is between 30 seconds and 90 seconds. The solvent in the photoresist liquid can be removed through the heating process, so that the formed photoresist layer can be thinner and has greater adhesion to the wafer 10.

Following the above description, the temperature of the wafer 10 during the heating process affects the evaporation speed and the removal amount of the solvent in the photoresist liquid. Specifically, the higher the temperature of the wafer 10, the more the solvent in the photoresist liquid evaporates, thereby forming a thinner photoresist layer. Conversely, the lower the temperature of the wafer 10, the less the solvent in the photoresist liquid evaporates, thereby forming a thicker photoresist layer. Therefore, the temperature of the wafer 10 during the heating process can be used to adjust the thickness of the photoresist layer. In an embodiment of the present invention, the temperature of the wafer 10 is gradually increased in the reference direction Dr during the heating process, so that the thickness of the photoresist layer is gradually reduced in the reference direction Dr.

Figure 3:
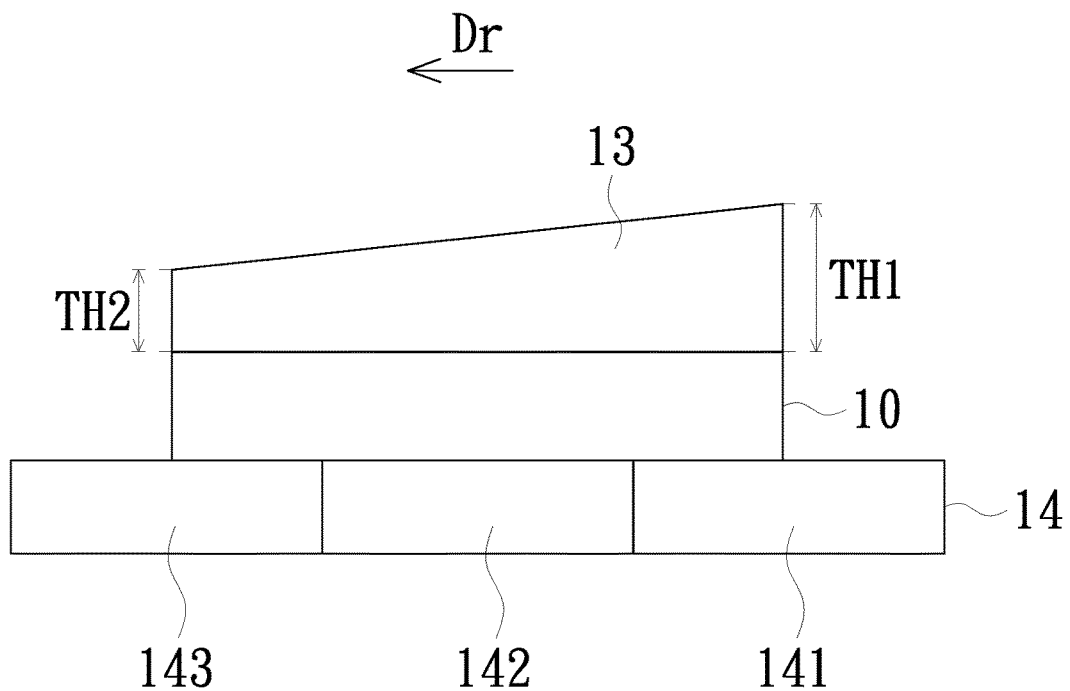
FIG. 3 is a schematic diagram of a heating device and a wafer of a wafer processing method according to an embodiment of the present invention.

FIG. 3 is a schematic diagram of a heating device and a wafer of a wafer processing method according to an embodiment of the present invention. In an embodiment of the present invention as shown in FIG. 3, the heating process can be performed by a heating device 14. The heating device 14 includes a plurality of heating units, preferably more than three heating units, and the temperature of the wafer 10 is gradually increased in the reference direction Dr through the temperature control of the heating units during the heating process. As shown in FIG. 3, the heating device 14 includes a first heating unit 141, a second heating unit 142 and a third heating unit 143. The first heating unit 141, the second heating unit 142 and the third heating unit 143 are sequentially provided in the reference direction Dr. That is, the first heating unit 141 is provided corresponding to the first position 11 (shown in FIG. 2) of the wafer 10, the third heating unit 143 is provided corresponding to the second position 12 (shown in FIG. 2) of the wafer 10, and the second heating unit 142 is provided between the first heating unit 141 and the third heating unit 143. The first heating unit 141, the second heating unit 142 and the third heating unit 143 may be hot plates. In order to form a photoresist layer 13 with a continuous thickness change on the wafer 10, the first set temperature of the first heating unit 141 is set lower than the second set temperature of the second heating unit 142, and the second set temperature is set lower than the third set temperature of the third heating unit 143. Therefore, after the heating process, a part of the photoresist layer 13 at the first position 11 of the wafer 10 has the first thickness TH1, a part of the photoresist layer 13 at the second position 12 of the wafer 10 has a second thickness TH2 which is less than the first thickness TH1, and the thickness of a part of the photoresist layer 13 between the first position 11 and the second position 12 gradually decreases from the first thickness TH1 at the first position 11 in the reference direction Dr to the second thickness TH2 at the second position 12. In an embodiment of the present invention, the first thickness TH1 and the second thickness TH2 are both between 9000 angstroms and 11500 angstroms. The heating device 14 shown in FIG. 3 corresponds to the configuration shown in FIG. 2 in which the first position 11 and the second position 12 of the wafer 10 are the two points at the edge of the wafer 10 and the connection between the first position 11 and the second position 12 passes through the center C of the wafer 10. The first heating unit 141, the second heating unit 142 and the third heating unit 143 of the heating device 14 shown in FIG. 3 can be three heating units provided side by side and of the same size, but the heating device of the present invention is not limited thereto. The size and shape of each heating unit can be different. In addition, in an embodiment not shown, the first position of the wafer can be set at the center of the wafer, the second position can be any point at the edge of the wafer, and the reference direction is from the center to the outer circumference of the circle. Correspondingly, the heating units of the heating device can be provided along concentric circles. For example, the first heating unit is a circular heating unit located at the center of the wafer, the second heating unit is an annular heating unit, and the third heating unit is an annular heating unit corresponding to the block at the outermost periphery of the wafer. The heating device arranged in this way can form a photoresist layer in which the thickness in the center area is greater than that at the outer edge after the wafer is heated, that is, the thickness of the photoresist layer gradually decreases from the center to the outer periphery of the wafer.

Figure 4:
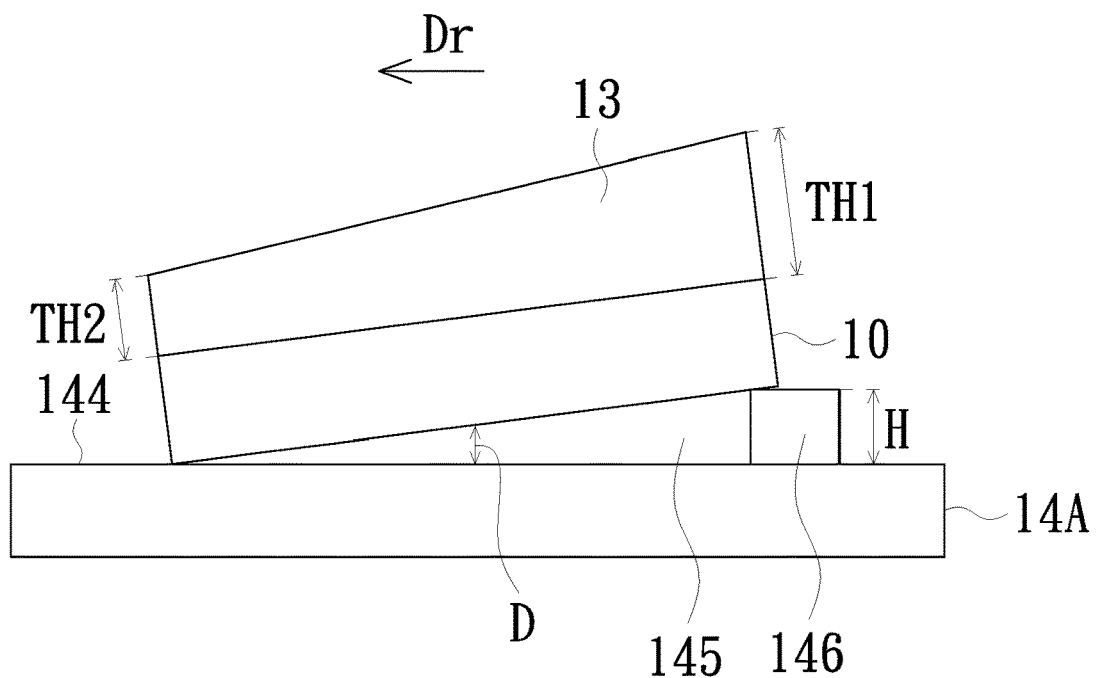
FIG. 4 is a schematic diagram of a heating device and a wafer of a wafer processing method according to another embodiment of the present invention.

FIG. 4 is a schematic diagram of a heating device and a wafer of a wafer processing method according to another embodiment of the present invention. Different from the above-mentioned hot plate heating method as shown in FIG. 3 in which the entire wafer is directly placed on the heating device, in this embodiment as shown in FIG. 4, a gap 145 is formed between the wafer 10 and the heating device 14A and the temperature of the wafer 10 during the heating process is adjusted by the size of the gap 145. In an embodiment of the present invention, the gap 145 is formed by obliquely placing the wafer 10 on the top surface 144 of the heating device 14A, and the height of the gap 145 (i.e., the distance D between the wafer 10 and the top surface 144) is gradually reduced from the first position 11 (shown in FIG. 2) to the second position 12 (shown in FIG. 2) in the reference direction Dr. The greater the distance D between the wafer 10 and the top surface 144, the lower the temperature of the wafer 10, which affects the degree of evaporation of the solvent in the photoresist liquid. Specifically, the lower the temperature, the less the amount of solvent removed, thus forming a thicker photoresist layer 13. The distance D between the wafer 10 and the top surface 144 gradually decreases in the reference direction Dr, which means that the temperature of the wafer 10 gradually increases in the reference direction Dr, thereby forming a photoresist layer 13 with a continuous thickness change on the wafer 10.

In an embodiment of the present invention, at least one spacer 146 is provided on the top surface 144 of the heating device 14A. The height H of the spacer 146 is between 0.1 mm and 2 mm, and preferably, the height H of the spacer 146 is between 0.1 mm and 1 mm. The wafer 10 can be placed on the top surface 144 obliquely by placing the first position 11 of the wafer 10 on the spacer 146 and placing the second position 12 directly on the top surface 144 of the heating device 14A. After the heating process, a part of the photoresist layer 13 at the first position 11 of the wafer 10 has a first thickness TH1, a part of the photoresist layer 13 at the second position 12 of the wafer 10 has a second thickness TH2, and the first thickness TH1 is greater than the second thicknesses TH2. In an embodiment of the present invention, the first thickness TH1 and the second thickness TH2 are both between 9000 angstroms and 11500 angstroms.

The present invention provides a wafer processing method. Specifically, by gradually increasing the temperature of the wafer coated with the photoresist liquid from the first position to the second position in the reference direction during the heating process, the evaporation of the solvent in the photoresist liquid on the wafer is different, thereby forming a photoresist layer with inconsistent thickness, such that the thickness of the photoresist layer decreases in the reference direction. The wafer processing method of the present invention can form a photoresist layer with continuous thickness change on a single wafer, so that a single wafer can be used as multiple samples for the critical dimension sampling measurement. Therefore, the wafer processing method of the present invention can greatly reduce the number of wafers required for the critical dimension sampling measurement and at the same time improve the accuracy of the critical dimension sampling measurement.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A wafer processing method, comprising the following steps in sequence:
   providing a wafer, wherein the wafer has a first position and a second position, and the first position faces the second position in a reference direction;
   coating a photoresist liquid on the wafer; and
   performing a heating process to heat the wafer coated with the photoresist liquid to form a photoresist layer on the wafer,
   wherein during the heating process, a temperature of the wafer gradually increases in the reference direction, so that a thickness of the photoresist layer gradually decreases in the reference direction,
   wherein a distance between the first position and the second position is equal to a diameter of the wafer, the reference direction is a diameter direction of the wafer, and the temperature of the wafer gradually increases from the first position on an edge of the wafer to the second position on another edge of the wafer along the diameter direction, so that the thickness of the photoresist layer gradually decreases from the first position to the second position of the wafer along the diameter direction.

2. The wafer processing method according to claim 1, wherein the heating process is performed by a heating device, and the heating device comprises a first heating unit, a second heating unit and a third heating unit.

3. The wafer processing method according to claim 2, wherein the first heating unit, the second heating unit and the third heating unit are set at a first set temperature, a second set temperature and a third set temperature to heat the wafer, respectively, wherein the first set temperature is lower than the second set temperature, and the second set temperature is lower than the third set temperature.

4. The wafer processing method according to claim 3, wherein the first heating unit, the second heating unit and the third heating unit are provided in sequence in the reference direction.

5. The wafer processing method according to claim 3, wherein the first set temperature, the second set temperature and the third set temperature are all between 90° C. and 110° C.

6. The wafer processing method according to claim 1, wherein the heating process is performed by a heating device, the heating device has a top surface, the wafer is placed obliquely on the top surface, and a distance between the wafer and the top surface gradually decreases in the reference direction.

7. The wafer processing method according to claim 6, wherein at least one spacer is provided on the top surface, and the first position of the wafer is placed on the at least one spacer.

8. The wafer processing method according to claim 7, wherein a height of the at least one spacer is between 0.1 mm and 2 mm.

9. The wafer processing method according to claim 8, wherein the height of the at least one spacer is between 0.1 mm and 1 mm.

10. The wafer processing method according to claim 1, wherein the thickness of the photoresist layer is between 9000 angstroms and 11500 angstroms.

* * * * *